United States Patent
Chu et al.

(10) Patent No.: US 7,750,693 B2
(45) Date of Patent: Jul. 6, 2010

(54) FREQUENCY DIVIDER INCLUDING LATCH CIRCUITS

(75) Inventors: Meng Chu, Singapore (SG); Seeteck Tan, Singapore (SG)

(73) Assignee: O2Micro, Inc., Santa Clara, CA (US)

( * ) Notice: Subject to any disclaimer, the term of this patent is extended or adjusted under 35 U.S.C. 154(b) by 63 days.

(21) Appl. No.: 12/156,909

(22) Filed: Jun. 5, 2008

(65) Prior Publication Data

US 2008/0303561 A1   Dec. 11, 2008

Related U.S. Application Data

(60) Provisional application No. 60/933,394, filed on Jun. 5, 2007.

(51) Int. Cl.
  *H03K 23/00* (2006.01)
(52) U.S. Cl. .................................. 327/115; 327/117
(58) Field of Classification Search .............. 327/115, 327/117, 118, 201, 202
See application file for complete search history.

(56) References Cited

U.S. PATENT DOCUMENTS

| | | | | |
|---|---|---|---|---|
| 5,714,394 | A * | 2/1998 | Kadosh et al. | 438/199 |
| 5,801,565 | A * | 9/1998 | Kuo | 327/202 |
| 5,818,293 | A * | 10/1998 | Brehmer et al. | 327/202 |
| 6,104,214 | A | 8/2000 | Ueda et al. | 326/115 |
| 6,166,571 | A | 12/2000 | Wang | 327/115 |
| 6,501,314 | B1 * | 12/2002 | Ling | 327/202 |
| 6,762,624 | B2 * | 7/2004 | Lai | 326/115 |
| 6,777,988 | B2 | 8/2004 | Tung et al. | 327/115 |
| 6,831,489 | B2 | 12/2004 | Cheung et al. | 327/115 |
| 6,861,888 | B2 * | 3/2005 | Hsieh | 327/208 |
| 7,154,294 | B2 * | 12/2006 | Liu et al. | 326/27 |
| 7,233,211 | B2 * | 6/2007 | Li | 331/74 |
| 7,236,029 | B2 * | 6/2007 | Gossmann | 327/202 |
| 7,298,183 | B2 * | 11/2007 | Mirzaei et al. | 327/115 |
| 7,429,874 | B2 * | 9/2008 | Byun et al. | 326/81 |
| 7,521,976 | B1 * | 4/2009 | Sudjian et al. | 327/199 |
| 2005/0110525 | A1 * | 5/2005 | Chen | 326/115 |
| 2006/0145743 | A1 | 7/2006 | Neubauer | 327/203 |

OTHER PUBLICATIONS

"RF Microelectronic", Chapter 8.4, Frequency Divider, Behzad Razavi (Pate 290-Pate 296, 6 pates).
"The Impact of Device Type and Sizing on Phase Noise Mechanisms", IEEE Journal of Solid State Circuits, vol. 40, No. 2, Feb. 2005 (Pate 360-p. 369, 10 pages).
"Design of Analog CMOS Integrated Circuits", Chapter 2.3, Body Effect, Behzad Razavi (p. 23-p. 28, 6 pages).

* cited by examiner

*Primary Examiner*—Lincoln Donovan
*Assistant Examiner*—Thomas J Hiltunen (57) ABSTRACT

A frequency divider is disclosed herein. The frequency divider includes a first latch circuit and a second latch circuit coupled to the first latch circuit. Each of the first latch circuit and the second latch circuit includes a first level for generating a source current, a second level for receiving a pair of input signals and for generating a pair of output signals, and a third level for receiving the source current and a pair of clock signals. The second level is coupled between the first level and the third level. The first level includes a first transistor having a source terminal and a substrate both coupled to a source voltage. The third level includes a plurality of transistors controlled by the pair of clock signals. Each transistor in the third level has a source terminal and a substrate both coupled to ground.

18 Claims, 9 Drawing Sheets

FREQUENCY DIVIDER INCLUDING LATCH CIRCUITS

RELATED APPLICATION

This application claims priority to U.S. provisional application, titled "High Speed Divide-by-two Circuit", Ser. No. 60/933,394, filed on Jun. 5, 2007, which is incorporated herein by reference in its entirety.

TECHNICAL FIELD

Embodiments in accordance with the present invention relates to a frequency divider, and more particular, to a frequency divider including latch circuits.

BACKGROUND

Currently, the demands of higher-performance electronic circuits are increasing since the related technologies have been rapidly developed. As a result, a frequency divider, such as a divide-by-two circuit (DTC) has been widely used in the electronic circuits to meet the demands in different fields (e.g., global positioning system (GPS) receiver, code division multiple access (CDMA) transceiver, etc.).

Figure 1:
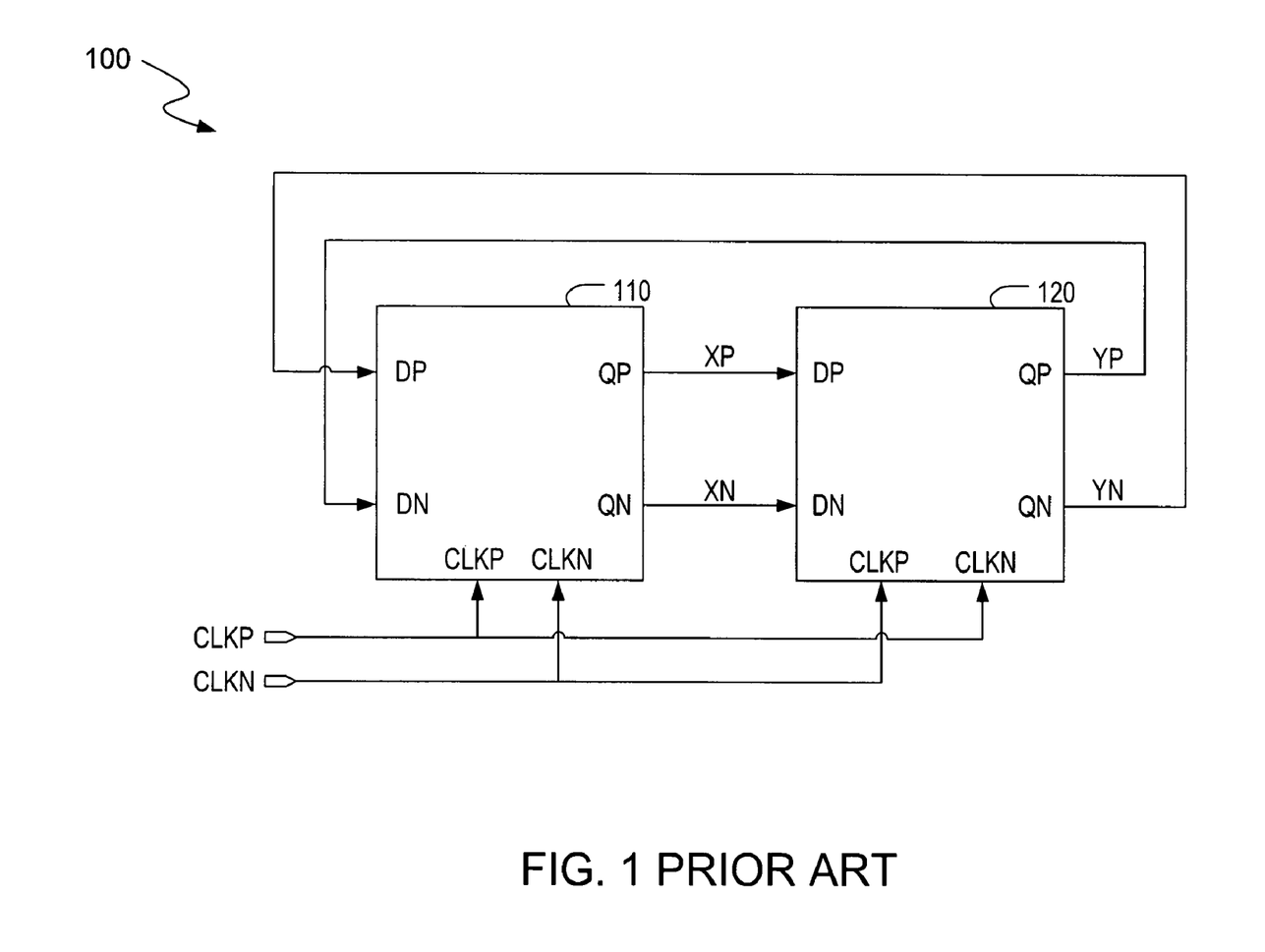
FIG. 1 is a block diagram of a conventional divide-by-two circuit (DTC).

FIG. 1 is a block diagram of a conventional DTC 100. The DTC 100 can employ two identical latch circuits (e.g., latch circuits 110 and 120). An output of one latch circuit is sent to an input of the other latch circuit, and vice versa. Each latch circuit is controlled by a pair of complementary clock signals CLKP and CLKN, and has a pair of input terminals (DP and DN) and a pair of output terminals (QP and QN).

Figure 2:
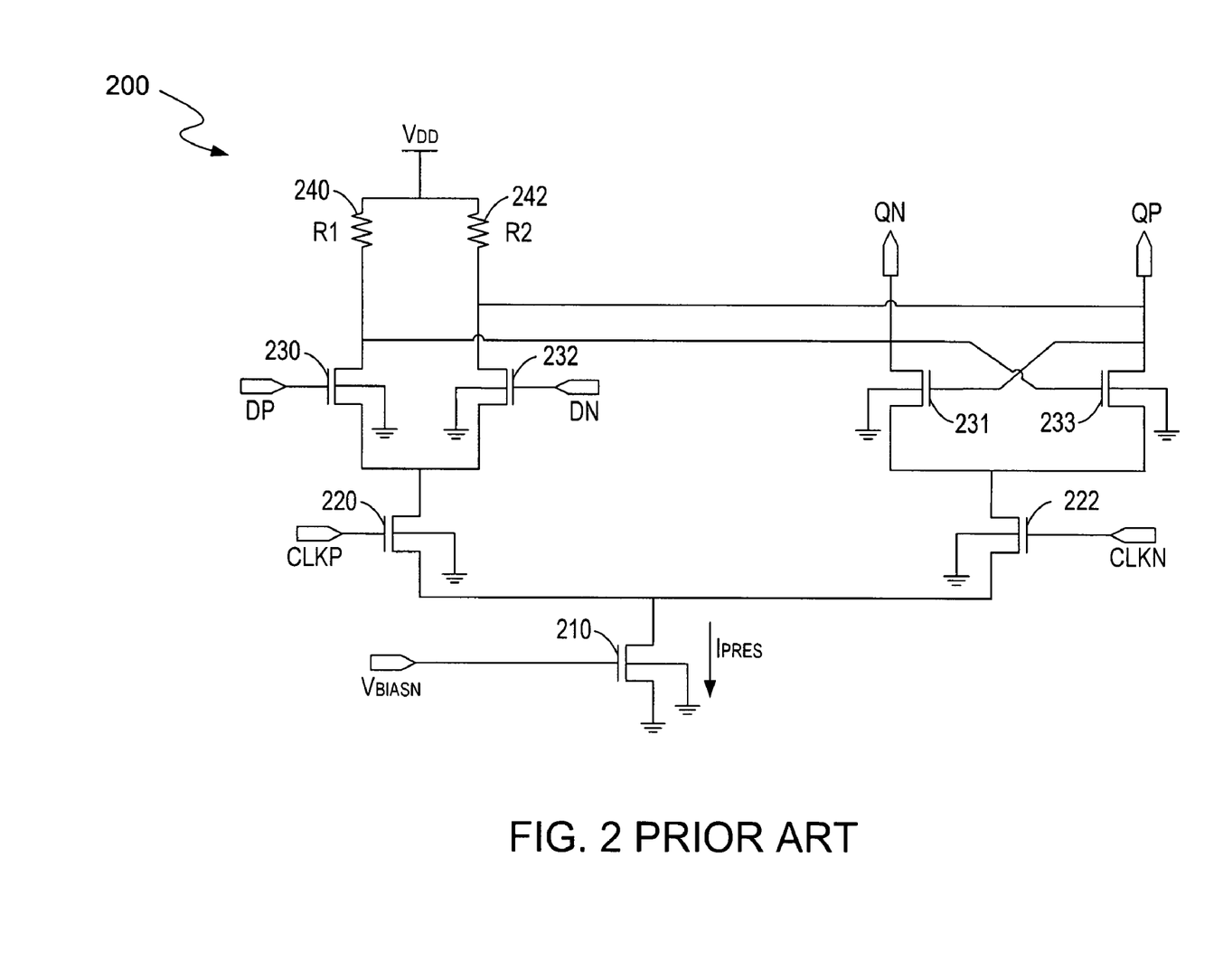
FIG. 2 is a block diagram of a conventional latch circuit in a DTC.

FIG. 2 is a block diagram of a conventional latch circuit 200 in a DTC (e.g., the latch circuit 110 or 120 in the DTC 100). The latch circuit 200 can include a number of successive levels of circuits in a direction from ground to a source voltage $V_{DD}$. The first level includes a NMOS transistor 210 functioning as a current source. The NMOS transistor 210 has a source terminal coupled to ground and a gate terminal receiving a control voltage $V_{BIASN}$. In the first level, a current $I_{PRES}$ (that can be also called a source current) flows through the NMOS transistor 210 when the NMOS transistor 210 operates in an active region. The second level includes source-coupled NMOS transistors 220 and 222 with their source terminals coupled to a drain terminal of the NMOS transistor 210 and their respective gate terminals coupled to a pair of complementary clock signals CLKP and CLKN. The third level includes a first and second sub-circuits coupled in parallel. The first sub-circuit includes a pair of source-coupled NMOS transistors 230 and 232 that can receive the input signals DP and DN. A drain terminal of the NMOS transistor 230 is bridged to the source voltage $V_{DD}$ via a serial resistor 240 and a drain terminal of the NMOS transistor 232 is bridged to the source voltage $V_{DD}$ via a serial resistor 242. The second sub-circuit includes a pair of cross-coupled NMOS transistors 231 and 233. The drain terminals of the NMOS transistors 230 and 231 are coupled to a gate terminal of the NMOS transistor 233. The drain terminals of the NMOS transistors 232 and 233 are coupled to a gate terminal of the NMOS transistor 231.

The output signal QP is logic high (e.g., $V_{DD}$) and the output signal QN is logic low (e.g., $V_{DD} - I_{PRES}*R_1$) when the NMOS transistor 230 is turned on and the NMOS transistor 232 is turned off. Similarly, the output signal QP is logic low (e.g., $V_{DD} - I_{PRES}*R_2$) and the output signal of QN is logic high (e.g., $V_{DD}$) when the NMOS transistor 230 is turned off and the NMOS transistor 232 is turned on. Therefore, a voltage swing of the output signal QN is a difference between logic high and logic low, which can be given by equation (1).

$$V_{SWING} = V_{HIGH} - V_{LOW} = V_{DD} - (V_{DD} - I_{PRES}*R_1)$$
$$= I_{PRES}*R_1 \qquad (1)$$

$V_{SWING}$ represents the voltage swing of the output signal QN. $V_{HIGH}$ represents a voltage value of QN when the output signal QN is logic high. $V_{Low}$ represents a voltage value of QN when the output signal QN is logic low. $R_1$ represents the resistance of the serial resistor 240. Similarly, a voltage swing of the output signal QP can be equal to $I_{PRES}*R_2$. $R_2$ represents the resistance of the serial resistor 242.

Figure 3:
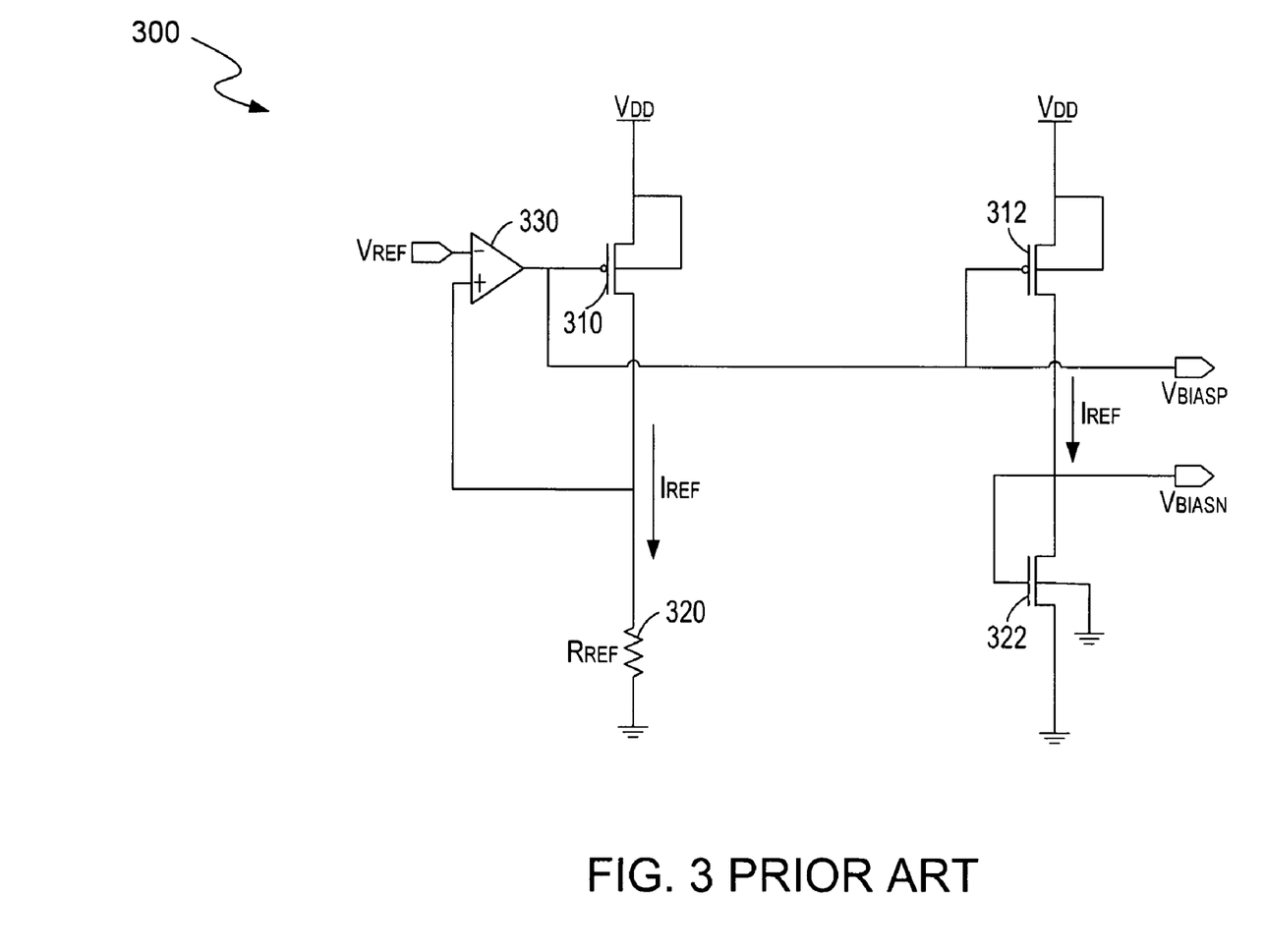
FIG. 3 is a block diagram of a conventional bias circuit for controlling a latch circuit.

FIG. 3 is a block diagram of a conventional bias circuit 300 for controlling a latch circuit (e.g., the latch circuit 200). The bias circuit 300 can provide a voltage $V_{BIASN}$ to the gate terminal of the NMOS transistor 210. The bias circuit 300 includes gate-coupled PMOS transistors 310 and 312 with their source terminals coupled to the source voltage $V_{DD}$. A drain terminal of the PMOS transistor 310 is coupled to ground through a serial resistor 320 and a drain terminal of the PMOS transistor 312 is coupled to ground through a NMOS transistor 322.

The bias circuit 300 also includes an operational amplifier 330 with its output terminal coupled to the gate terminal of the PMOS transistor 310 and its positive input terminal coupled to the drain terminal of the PMOS transistor 310. An input reference voltage is received by the operational amplifier 330 and the drain voltage of the PMOS transistor 310 is forced to be equal to the input reference voltage. Since the PMOS transistors 310 and 312 form a current mirror and the size of the PMOS transistor 310 is equal to that of the PMOS transistor 312, the current flowing through the PMOS transistor 312 can be equal to the current flowing through the serial resistor 320. The current flowing through the NMOS transistor 210 can be equal to the current flowing though the serial resistor 320 when the NMOS transistor 210 has a same size as the NMOS transistor 322, as shown by equation (2).

$$I_{PRES} = V_{REF}/R_{REF} \qquad (2)$$

$V_{REF}$ represents the input reference voltage at the negative terminal of the operational amplifier 330. $R_{REF}$ represents the resistance of the serial resistor 320.

Therefore, the voltage swing of the output signal QN in FIG. 2 can be obtained by equation (3).

$$V_{SWING} = I_{PRES}*R_1 = V_{REF}*(R_1/R_{REF}) \qquad (3)$$

Figure 4:
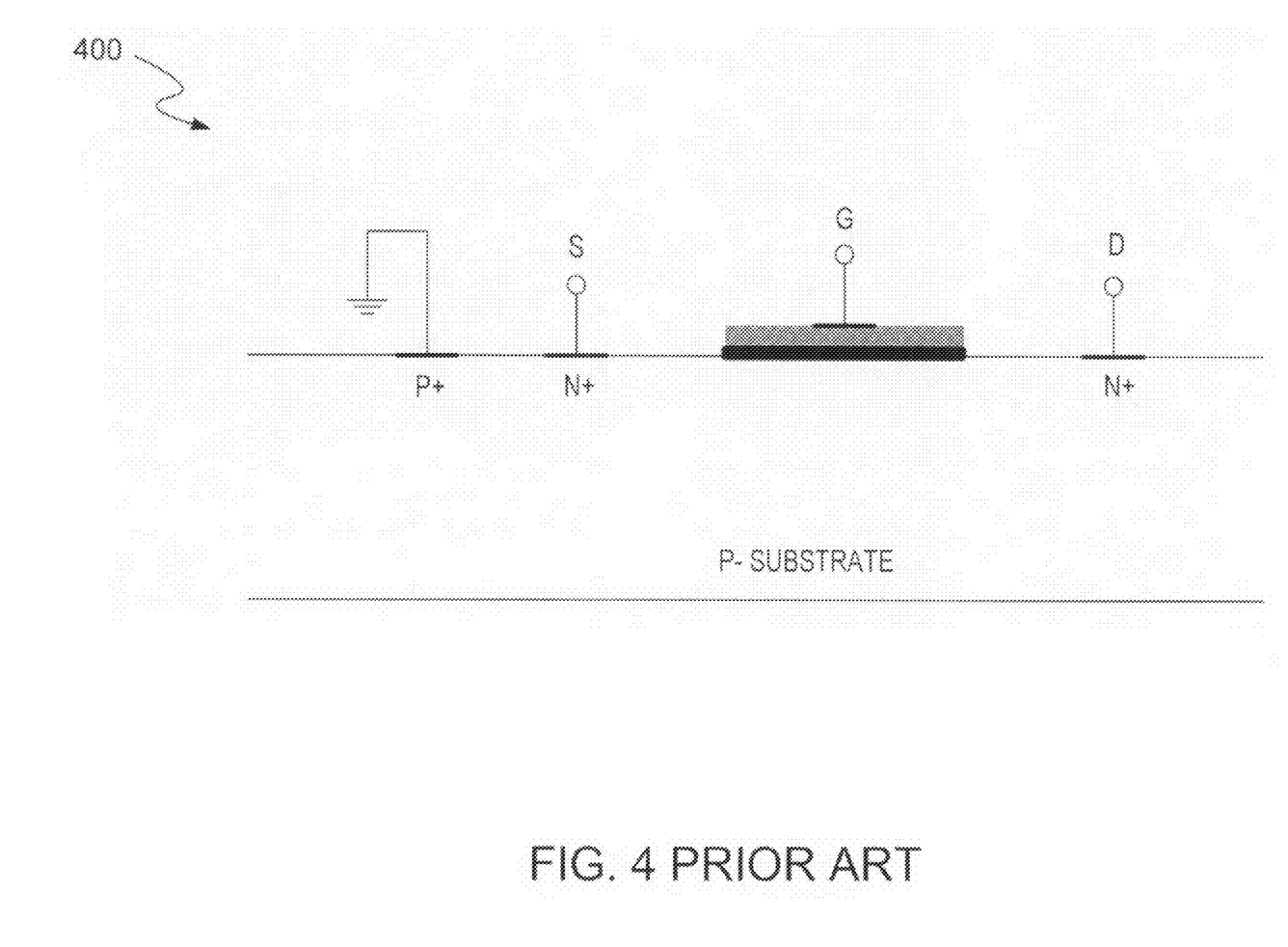
FIG. 4 is a structure diagram of a conventional NMOS transistor in a latch circuit.

FIG. 4 is a structure diagram of a conventional NMOS transistor 400 in a latch circuit (e.g., the latch circuit 200). The NMOS transistor 400 can be any of the NMOS transistors 210, 220, 222, and 230-233. The NMOS transistor 400 is manufactured in a common p-substrate coupled to ground. And there are voltage differences between bulks (e.g., the p-substrate) and the source terminals of the NMOS transistors 220, 222, and 230-233. For example, a voltage difference between the bulk and the source terminal of the NMOS transistor 220 or 222 can be equal to a voltage difference between the drain terminal and the source terminal the NMOS transistor 210, e.g., $V_{DS\_210}$. The voltage difference between the bulk and the source terminal of the NMOS transistor 230, 231, 232, or 233 can be equal to a summation of the voltage difference between the drain terminal and the source terminal of the NMOS transistor 210 and a voltage difference between the drain terminal and the source terminal of the NMOS transistor 220 or 222, e.g., $V_{DS\_210} + V_{DS\_220}$ or $V_{DS\_210} + V_{DS\_222}$. Accordingly, threshold voltages of the NMOS transistors 220, 222, and 230-233 are increased as a result of body-bias effect. Due to the body-bias effect, a relatively high voltage swing for the clock signals CLKP and CLKN is required to fully turn on and turn off the NMOS transistors 220 and 222. Therefore, it may be difficult to decrease the voltage of a power source (e.g., $V_{DD}$). The higher voltage swing can also impose limitations on previous stages (not shown) which are coupled to the DTC 100 in FIG. 1. For example, in order to maintain the desirable speed performance, the DTC 100 may require a higher current from the previous stages. In this condition, an extra buffer may be needed to be coupled between the previous stages and the DTC 100 in order to provide a required output voltage swing of the DTC 100.

Figure 5:
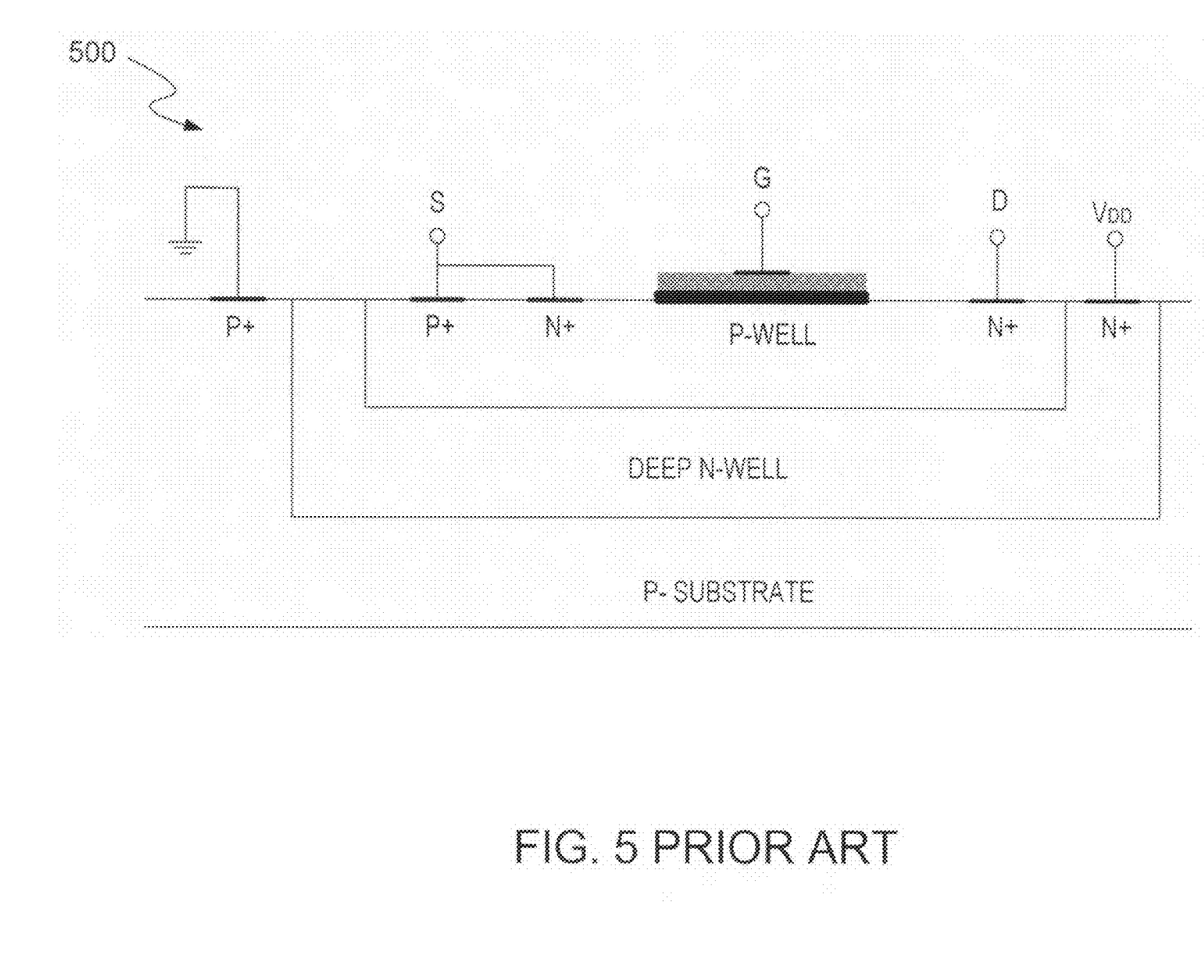
FIG. 5 is a structure diagram of a conventional isolated NMOS transistor in a latch circuit.

FIG. 5 is a structure diagram of a conventional isolated NMOS transistor 500 in a latch circuit (e.g., the latch circuit 200). The isolated NMOS transistor 500 can be employed to substitute the NMOS transistor 400 used in the latch circuit 200 to eliminate the drawbacks introduced by the body-bias effect resulting from the NMOS transistor 400. The isolated NMOS transistor 500 is built in a p-well, instead of directly in a p-substrate, and is electrically isolated from the p-substrate via a deep n-well. The source, gate and drain terminals of the isolated NMOS transistor 500 can be isolated from the substrate and hence the body-bias effect can be eliminated.

Although the introduction of the isolated NMOS transistor 500 can eliminate the body-bias effect, it can also introduce parasitic capacitance in the latch circuit 200. The parasitic capacitance introduced by the isolated NMOS transistor 500 can be substantially higher than the parasitic capacitance introduced by the NMOS transistor 400. Due to the parasitic capacitance introduced by the isolated NMOS transistor 500, the performance of the latch circuit 200 with the isolated NMOS transistor 500 can be limited.

SUMMARY

A frequency divider is disclosed herein. In one embodiment, the frequency divider includes a first latch circuit and a second latch circuit coupled to the first latch circuit. Each of the first latch circuit and the second latch circuit includes a first level for generating a source current, a second level for receiving a pair of input signals and for generating a pair of output signals, and a third level for receiving the source current and a pair of clock signals. The second level is coupled between the first level and the third level. The first level includes a first transistor having a source terminal and a substrate both coupled to a source voltage. The third level includes a plurality of transistors controlled by the pair of clock signals. Each transistor in the third level has a source terminal and a substrate both coupled to ground.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

The present invention discloses a frequency divider with improved performance. Since the embodiments shown in the drawings are only for illustrative purposes, some sub-components and/or peripheral components generally incorporated in the invention are omitted herein. In describing the embodiments in accordance with the present invention, specific terminologies are employed for the sake of clarity. However, the disclosure of this patent specification is not intended to be limited to the selected terminology and the specified embodiments. It is understood that each specific element includes all technical equivalents that operate in a similar manner.

Figure 6:
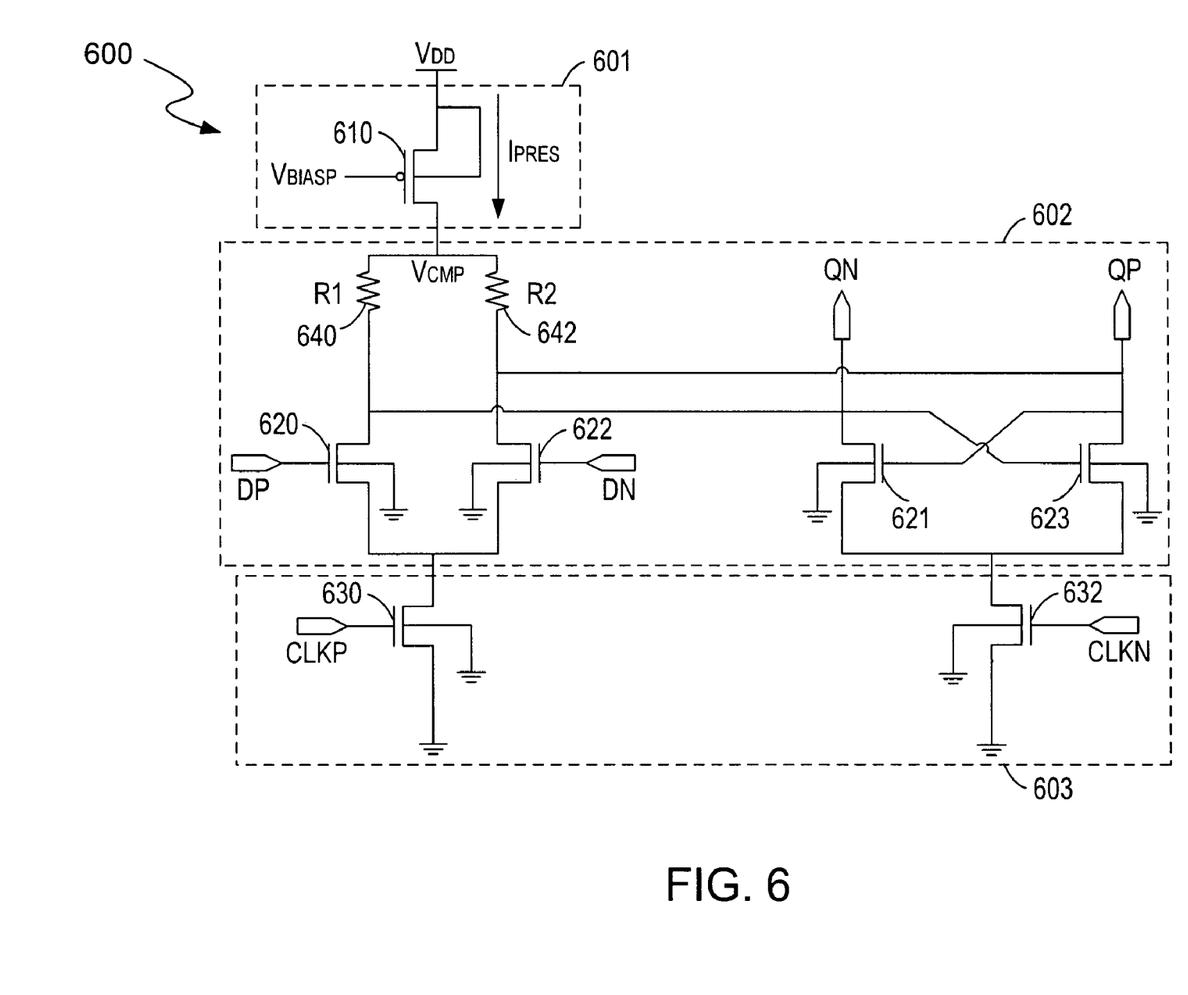
FIG. 6 is a block diagram of a latch circuit, in accordance with one embodiment of the present invention.

FIG. 6 illustrates a block diagram of a latch circuit 600, in accordance with one embodiment of the present invention. In one embodiment, the latch circuit 600 can include a number of successive levels (e.g., three successive levels) of circuits in a direction from a source voltage $V_{DD}$ to ground GND.

In one embodiment, the first level 601 can include, but is not limited to a transistor (e.g., a PMOS transistor) 610 operating as a current source. The PMOS transistor 610 has a source terminal and a substrate both coupled to the source voltage $V_{DD}$, and has a gate terminal coupled to a pin/line for receiving a control voltage $V_{BIASP}$. In the first level 601, a current $I_{PRES}$ (that can also be called a source current) can be generated and flow through the PMOS transistor 610 when the PMOS transistor 610 operates in an active region.

In one embodiment, the second level 602 can include, but is not limited to a first and second sub-circuit coupled in parallel. In one embodiment, the first sub-circuit can include, but is not limited to a pair of source-coupled transistors (e.g., NMOS transistors) 620 and 622 that can receive input signals DP and DN respectively. A drain terminal of the PMOS transistor 610 is coupled to a drain terminal of the NMOS transistor 620 via a serial resistor 640 and also coupled to a drain terminal of the NMOS transistor 622 via a serial resistor 642. In one embodiment, the second sub-circuit can include, but is not limited to a pair of cross-coupled transistors (e.g., NMOS transistors) 621 and 623 that can generate output signals QN and QP respectively. The drain terminals of the NMOS transistors 620 and 621 are coupled to a gate terminal of the NMOS transistor 623. The drain terminals of the NMOS transistors 622 and 623 are coupled to a gate terminal of the NMOS transistor 621. The voltage swing of the output signals QN and QP is in accordance with the source current $I_{PRES}$.

In one embodiment, the third level 603 can include, but is not limited to transistors (e.g., NMOS transistors) 630 and 632. Gate terminals of the NMOS transistors 630 and 632 respectively receive a pair of complementary clock signals CLKP and CLKN. Drain terminals of the NMOS transistors 630 and 632 are coupled to the source terminals of the NMOS transistors 620 and 621 respectively. Source terminals of the NMOS transistors 630 and 632 are coupled to ground. Substrates of the NMOS transistors 630 and 632 are, also coupled to ground.

When the clock signal CLKP is logic high and the clock signal CLKN is logic low, the NMOS transistor 630 is turned on and the NMOS transistor 632 is turned off. The PMOS transistor 610 and the NMOS transistors 620 and 622 can function as a differential pair. The current $I_{PRES}$ can flow from the PMOS transistor 610 to ground through the first sub-circuit and the NMOS transistor 630. A path of the current $I_{PRES}$ is further determined by logic values of the input signals DP and DN. In one embodiment, the input signal DN is complementary to the input signal DP. More specifically, when the input signal DP is logic high and the input signal DN is logic low, the NMOS transistor 620 is turned on and the NMOS transistor 622 is turned off. Thus, the current $I_{PRES}$ flows through the PMOS transistor 610, the resistor 640, and the NMOS transistor 620. If the drain voltage of the PMOS transistor 610 is $V_{CMP}$, the drain voltage of the NMOS transistor 620 (e.g., the voltage of the output signal QN) can be calculated by equation (4).

$$V_{LOW} = V_{CMP} - I_{PRES} * R_{LOAD\_L} \quad (4)$$

$R_{LOAD\_L}$ represents the resistance of the resistor 640. $V_{Low}$ represents the voltage value of QN when the output signal QN is logic low.

In such circumstance, since there is no current flowing through the resistor 642, the drain voltage of the NMOS transistor 622 (e.g., the voltage of the output signal QP) is pushed to VCMP as shown by equation (5).

$$V_{HIGH} = V_{CMP} \quad (5)$$

$V_{HIGH}$ represents the voltage value of QP when the output signal QP is logic high.

Similarly, when the input signal DP is logic low and the input signal DN is logic high, the output signal QP is logic low (e.g., $V_{CMP} - I_{PRES} * R_{LOAD\_R}$) and the output signal QN is pushed to logic high (e.g., $V_{CMP}$), in one embodiment. Therefore, the highest voltage of the output signal QN is $V_{CMP}$ (logic high) and the lowest voltage of the output signal QN is equal to $V_{CMP} - I_{PRES} * R_{LOAD\_L}$ (logic low), in one embodiment. As a result, a voltage swing of the output signal QN can be calculated by equation (6).

$$V_{SWING} = V_{HIGH} - V_{LOW} = V_{CMP} - (V_{CMP} - I_{PRES} * R_{LOAD\_L}) = I_{PRES} * R_{LOAD\_L} \quad (6)$$

Similarly, the voltage swing of the output signal QP is equal to $I_{PRES} * R_{LOAD\_R}$. $R_{LOAD\_R}$ represents the resistance of the resistor 642.

When the clock signal CLKP is changed from logic high to logic low and the clock signal CLKN is changed from logic low to logic high, the NMOS transistor 630 is turned off and the NMOS transistor 632 is turned on. In this condition, the current $I_{PRES}$ flows from the PMOS transistor 610 to ground through the second sub-circuit and the NMOS transistor 632. In such circumstance, the NMOS transistors 621 and 623 function as a regenerative latch to hold the levels of the output signals QP and QN obtained before the transition of the logic values of the clock signals CLKP and CLKN.

As stated previously, the output signal QP is logic high (e.g., $V_{CMP}$) and the output signal QN is logic low (e.g., $V_{CMP} - I_{PRES} * R_{LOAD\_L}$) when the NMOS transistor 620 is turned on and the NMOS transistor 622 is turned off. Similarly, the output signal QP is logic low (e.g., $V_{CMP} - I_{PRES} * R_{LOAD\_R}$) and the output signal QN is logic high (e.g., $V_{CMP}$) when the NMOS transistor 620 is turned off and the NMOS transistor 622 is turned on. Thus, a voltage swing of the output signal QP or QN is equal to $I_{PRES} * R_{LOAD\_L}$ or $I_{PRES} * R_{LOAD\_R}$, in one embodiment.

In FIG. 6, the source terminal and the bulk (p-substrate) of the NMOS transistor 630 or 632 are coupled to ground (GND). Therefore, the body-bias effect of the NMOS transistors 630 and 632 can be eliminated since there is no voltage difference between the bulk and the source terminal of the NMOS transistors 630 or 632. Advantageously, the latch circuit 600 can eliminate the drawbacks (which can impose limitations on the performance of the latch circuit) introduced by the body-bias effect of transistors 220 and 222, compared with the conventional latch circuit 200. The voltage difference between the bulk and the source terminal of the NMOS transistor 620 or 622 can be equal to the voltage difference between the drain terminal and the source terminal of the NMOS transistor 630 ($V_{DS\_630}$). Similarly, the voltage difference between the bulk and the source terminal of the NMOS transistor 621 or 623 can be equal to the voltage difference between the drain terminal and the source terminal of the NMOS transistor 632 ($V_{DS\_632}$). As a result, the body-bias effect of the NMOS transistor 620, 621, 622 or 623 can be reduced. Advantageously, smaller values of the input signals DP and DN can be used to conduct (e.g., fully turn on) the input level, e.g., the NMOS transistors 620 and 622. In other words, smaller level of voltage swing is required for the input signals DP and DN and for the clock signals CLKP and CLKN, in one embodiment.

Furthermore, as described above, a voltage swing of the output signal QP or QN is equal to $I_{PRES} * R_{LOAD\_L}$ or $I_{PRES} * R_{LOAD\_R}$, in one embodiment. Therefore, the voltage swing of output of the latch circuit 600 can be still the same as that of the latch circuit 200 under the condition that the source current of the latch circuit 600 is equal to that of the latch circuit 200 and the resistance of the resistors 640 and 642 is equal to that of the serial resistors 240 and 242 respectively, in one embodiment. Advantageously, the output voltage swing is prone to control because of a relatively easy regulation of values of the source current and the resistance of the relative resistors (e.g., the resistor 640 or 642), in one embodiment. In other words, the latch circuit 600 can maintain a well-controlled output voltage swing. In one embodiment, compared to the prior art (e.g., the latch circuit 200), the latch circuit 600 requires smaller level of voltage swing of the input signals while can still achieve the same level of voltage swing of the output signals.

Figure 7:
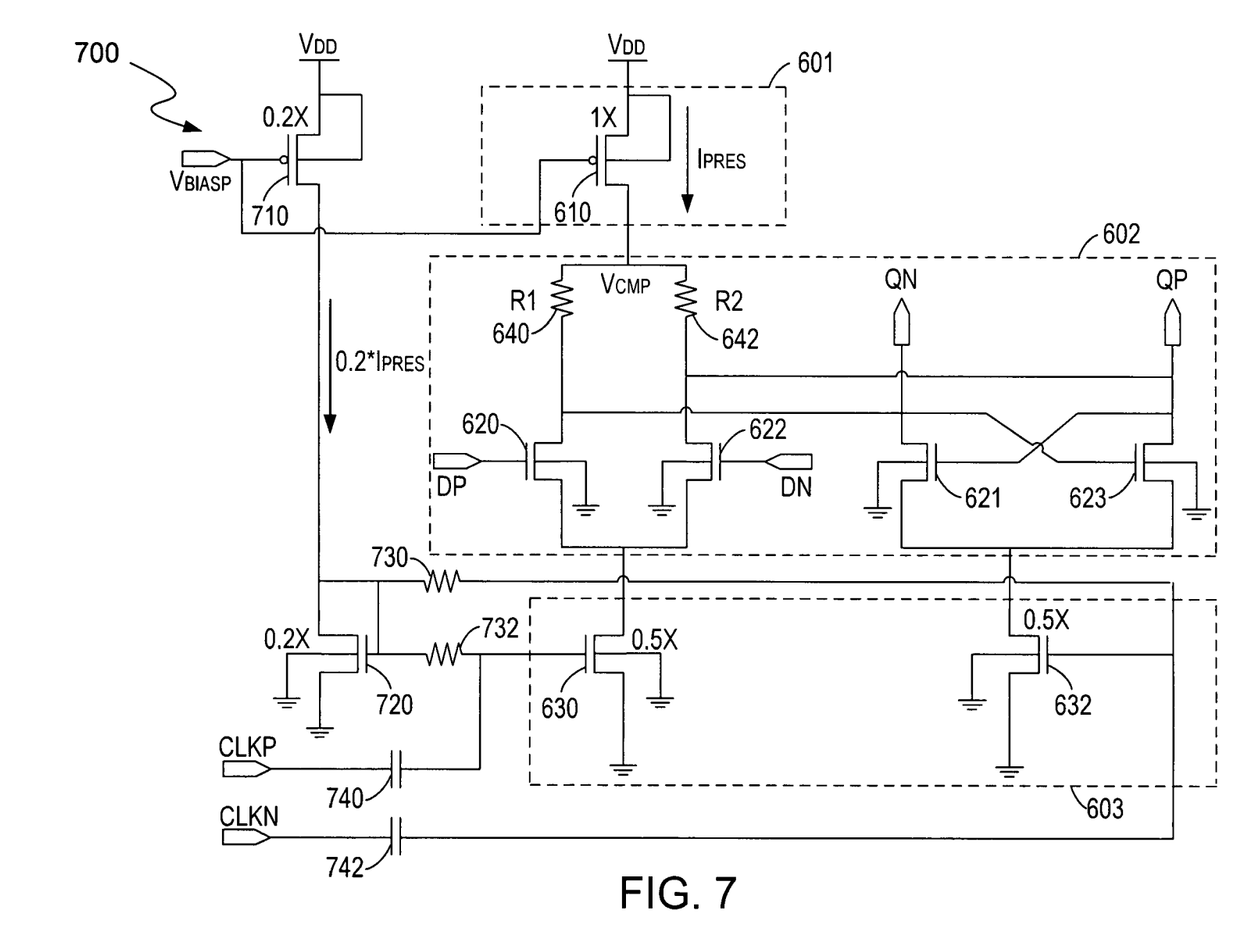
FIG. 7 is a block diagram of a latch circuit with a bias circuit, in accordance with one embodiment of the present invention.

FIG. 7 is a block diagram of a latch circuit 700 with a bias circuit, in accordance with one embodiment of the present invention. The symbols in FIG. 7 that are similar to those in FIG. 6 have similar functions as those in FIG. 6, and will not be detailed described herein for purposes of clarity.

In one exemplary embodiment, the latch circuit 700 can include an exemplary bias circuit formed by a PMOS transistor 710 and a NMOS transistor 720. The bias circuit can provide a bias voltage to control the NMOS transistor 610. The bias circuit in FIG. 7 can further provide complementary clock signals CLKP and CLKN to the third level 603. Resistors 730 and 732 can be used to block AC components from the bias circuit to the NMOS transistors 630 and 632 respectively. Capacitors 740 and 742 can be used to block DC components from the pair of complementary clock signals CLKP and CLKN to the NMOS transistors 630 and 632 respectively.

Figure 8:
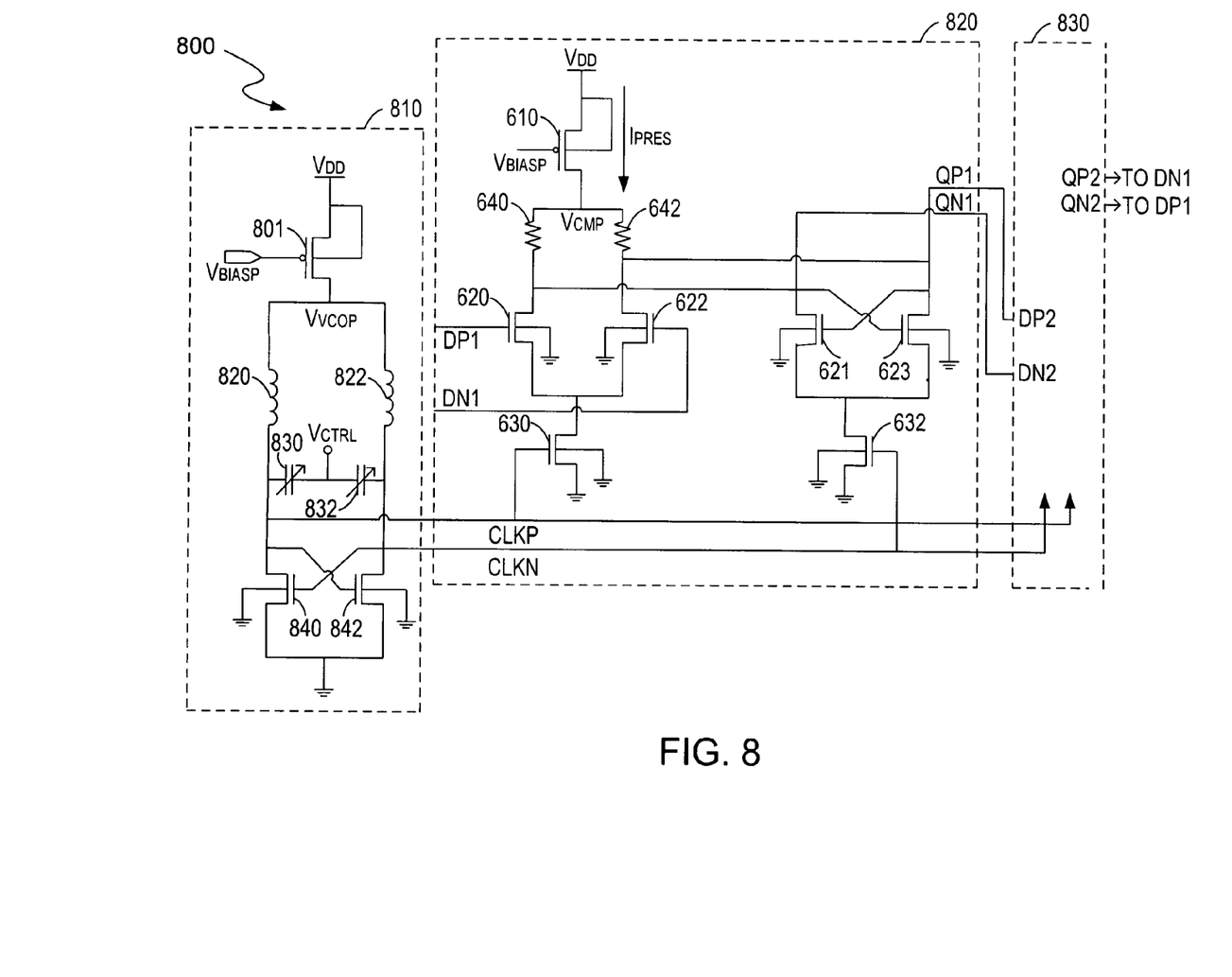
FIG. 8 is a block diagram of an electronic system including a frequency divider, in accordance with one embodiment of the present invention.

FIG. 8 is a block diagram of an electronic system 800, in accordance with one embodiment of the present invention. In one embodiment, the electronic system 800 can be implemented in, but is not limited to a global positioning system (GPS) receiver, a code division multiple access (CDMA) transceiver, etc. In one embodiment, the electronic system 800 can include a voltage control oscillator (VCO) 810 and a frequency divider. For purposes of exemplary illustration, the frequency divider in FIG. 8 is a divide-by-two circuit (DTC). However, other different frequency dividers can be formed by using different numbers of the latch circuits 600 in FIG. 6. The DTC circuit in FIG. 8 can include a first latch circuit 820 and a second latch circuit 830. The first latch circuit 820 is identical to the second latch circuit 830, in one embodiment. The first latch circuit 820 and the second latch circuit 830 can employ the configuration described in FIG. 6 or FIG. 7 and will not be detailed described herein. Output signals of the first latch circuit 820 are sent to the second latch circuit 830 as input signals of the second latch circuit 830. Similarly, output signals of the second latch circuit 830 are sent back to the first latch circuit 820 as input signals of the first latch circuit 820. As a result, the frequency of the signals DP2 and DN2 is half of the frequency of the clock signals CLKP and CLKN, in one embodiment.

In one exemplary embodiment, the VCO 810 can include a PMOS transistor 801 to generate a source current. The source current of the VCO 810 can flow through inductors 820 and 822, capacitors 830 and 832, and a pair of cross-coupled NMOS transistors 840 and 842. The NMOS transistors 840 and 842 can be equipped with a relatively large size in order to provide enough transconductance of the VCO 810 and provide enough voltage swing of output signals. The output signals (e.g., the pair of complementary clock signals CLKP and CLKN) can fully turn on the corresponding NMOS transistors (e.g., the NMOS transistors 630 and 632). In one embodiment, the NMOS transistors 630 and 632 are of a smaller size so that the electronic system 800 can operate in a higher frequency. Advantageously, a buffer to provide a higher input voltage swing of the DTC can be saved.

Figure 9:
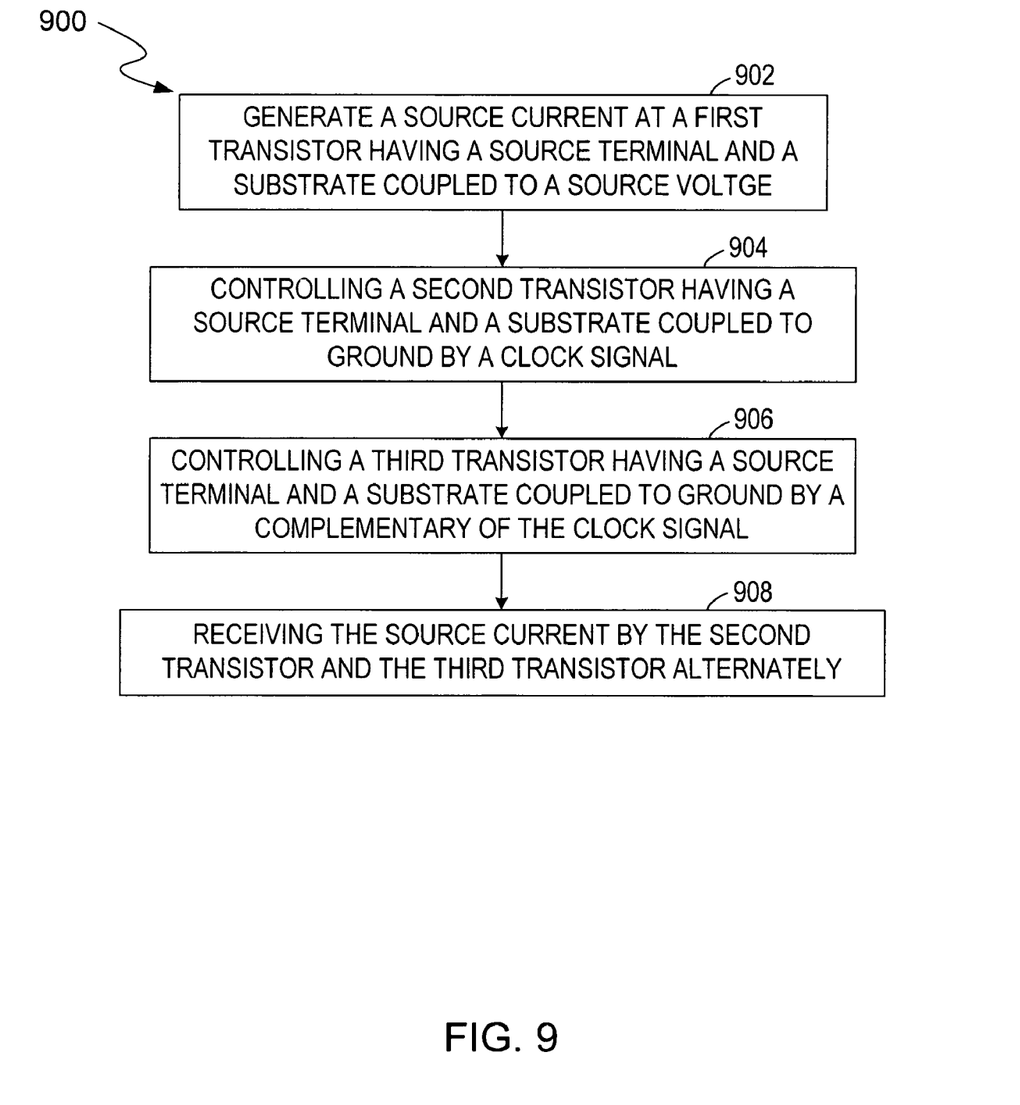
FIG. 9 is a flowchart of a method for dividing a frequency of an input signal, in accordance with one embodiment of the present invention.

FIG. 9 is a flowchart 900 of a method for dividing a frequency of an input signal (e.g., the clock signals CLKP and CLKN in FIG. 8), in accordance with one embodiment of the present invention. FIG. 9 is described in combination with FIG. 6. At step 902, a source current $I_{PRES}$ is generated by a first transistor (e.g., the PMOS transistor 610) having a source terminal and a substrate coupled to a source voltage. At step 904, a second transistor (e.g., the NMOS transistor 630) is controller by a clock signal (e.g., by the clock signal CLKP). The second transistor has a source terminal and a substrate coupled to ground. At step 906, a third transistor (e.g., the NMOS transistor 632) is controller by a complementary of the clock signal (e.g., by the clock signal CLKN). The third transistor has a source terminal and a substrate coupled to ground. At step 908, the second transistor and the third transistor receive the source current alternately under the control of the pair of clock signals CLKP and CLKN.

Accordingly, embodiments in accordance with the present invention provide a frequency divider that can include the first latch circuit 820 and the second latch circuit 830 coupled to the first latch circuit 820. The second latch circuit 830 can be identical to the first latch circuit 820. The first latch circuit 820 can include the first level 601, the second level 602 and the third level 603. The first level 601 (e.g., the PMOS transistor 610) can generate the source current $I_{PRES}$. The PMOS transistor 610 has the source terminal and the substrate both coupled to the source voltage $V_{DD}$.

The second level 602 is coupled between the first level 601 and the third level 603 for receiving a pair of input signals DN and DP and for generating a pair of output signals QN and QP. The second level 602 can generate the voltage swing of output signals QN and QP according to the source current $I_{PRES}$. The third level 603 (e.g., the NMOS transistors 630 and 632) can receive the pair of clock signals CLKP and CLKN. The NMOS transistor 630 can receive the source current $I_{PRES}$ via a pair of source-coupled transistors (e.g., the NMOS transistors 620 and 622). The NMOS transistor 632 can receive the source current $I_{PRES}$ via a pair of cross-coupled transistors (e.g., the NMOS transistors 621 and 623). The NMOS transistors 630 and 632 are controlled by the pair of clock signals CLKN and CLKP respectively. Each of the NMOS transistors 630 and 632 has the source terminal and the substrate both coupled to ground.

The embodiments that have been described herein, however, are but some of the several that utilize this invention and are set forth here by way of illustration but not of limitation. It is obvious that many other embodiments, which will be readily apparent to those skilled in the art, may be made without departing materially from the spirit and scope of the invention as defined in the appended claims. Furthermore, although elements of the invention may be described or claimed in the singular, the plural is contemplated unless limitation to the singular is explicitly stated.

What is claimed is:

1. A frequency divider comprising:
   a first latch circuit; and
   a second latch circuit coupled to said first latch circuit, wherein each of said first latch circuit and said second latch circuit comprises:
   a first level for generating a source current, said first level comprising a first transistor having a source terminal and a substrate both coupled to a source voltage;
   a second level for receiving a pair of input signals and for generating a pair of output signals, wherein said second level comprises a first sub-circuit and a second sub-circuit coupled in parallel, wherein said first sub-circuit comprises a pair of source-coupled transistors for receiving said pair of input signals, wherein said second sub-circuit comprises a pair of cross-coupled transistors for generating said pair of output signals, and wherein drain terminals of said pair of source-coupled transistors are coupled to a drain terminal of said first transistor from said first level; and
   a third level for receiving said source current and a pair of clock signals, said third level comprising a plurality of transistors controlled by said pair of clock signal, wherein each transistor of said plurality of transistors has a source terminal and a substrate both coupled to ground, and wherein said second level is coupled between said first level and said third level.

2. The frequency divider of claim 1, wherein said first transistor in said first level comprises a p-channel metal-oxide semiconductor (PMOS) transistor.

3. The frequency divider of claim 1, wherein each transistor in said third level comprises an n-channel metal-oxide semiconductor (NMOS) transistor.

4. The frequency divider of claim 1, wherein source terminals of said pair of source-coupled transistors and of said pair of cross-coupled transistors are coupled to drain terminals of said plurality of transistors from said third level.

5. The frequency divider of claim 1, further comprising:
   a bias circuit coupled to said first latch circuit and for controlling said first transistor.

6. The frequency divider of claim 1, wherein a voltage control oscillator is coupled to said frequency divider and generates said pair of clock signals.

7. The frequency divider of claim 1, wherein said plurality of transistors in said third level comprises a second transistor and a third transistor, and wherein said pair of clock signals comprises a first clock signal for controlling said second transistor and a second clock signal that is complementary to said first clock signal for controlling said third transistor, and wherein said source current is received by said second transistor and said third transistor alternately.

8. The frequency divider of claim 1, wherein said pair of output signals of said first latch circuit are provided as said pair of input signals of said second latch circuit, and wherein said pair of output signals of said second latch circuit are provided as said pair of input signals of said first latch circuit.

9. The frequency divider of claim 1, wherein a voltage swing of said pair of output signals varies in accordance with said source current.

10. A method comprising:
  generating a source current by a first transistor having a source terminal and a substrate coupled to a source voltage;
  controlling a second transistor having a source terminal and a substrate coupled to ground by a clock signal;
  controlling a third transistor having a source terminal and a substrate coupled to ground by a complementary of sais clock signal;
  receiving said source current by said second transistor and said third transistor alternately;
  receiving said source current by said second transistor via a pair of source-coupled transistors; and
  receiving said source current by said third transistor via a pair of cross-coupled transistors,
  wherein drain terminals of said pair of source-coupled transistors are coupled to a drain terminal of said first transistor.

11. The method of claim 10, wherein said first transistor comprises a p-channel metal-oxide semiconductor (PMOS) transistor.

12. The method of claim 10, wherein each of said second transistor and said third transistor comprises an n-channel metal-oxide semiconductor (NMOS) transistor.

13. The method of claim 10, wherein source terminals of said pair of source-coupled transistors and of said pair of cross-coupled transistors are coupled to drain terminals of said second transistor and said third transistor.

14. A latch circuit comprising:
  a first level for generating a source current, said first level comprising a first transistor having a source terminal and a substrate both coupled to a source voltage;
  a second level for receiving an input and generating an output of said latch circuit, and for controlling a voltage swing of said output according to said source current, wherein said second level comprises a first sub-circuit and a second sub-circuit coupled in parallel, wherein said first sub-circuit comprises a pair of source-coupled transistors for receiving said input, wherein said second sub-circuit comprises a pair of cross-coupled transistors for generating said output, and wherein drain terminals of said pair of source-coupled transistors are coupled to a drain terminal of said first transistor from said first level; and
  a third level for receiving a first clock signal, said third level comprising a second transistor having a source terminal and a substrate both coupled to ground, wherein said second level is coupled between said first level and said second level.

15. The latch circuit of claim 14, wherein said first transistor in said first level comprises a p-channel metal-oxide semiconductor (PMOS) transistor.

16. The latch circuit of claim 14, wherein said second transistor in said third level comprises an n-channel metal-oxide conductor (NMOS) transistor.

17. The latch circuit of claim 14, wherein source terminals of said pair of source-coupled transistors and of said pair of cross-coupled transistors are coupled to a drain terminal of said second transistor.

18. The latch circuit of claim 14, wherein said third level further comprises a third transistor and receives a second clock signal that is complementary to said first clock signal, and wherein said second transistor and said third transistor are controlled by said first clock signal and said second clock signal respectively, and wherein said source current is received by said second transistor and said third transistor alternately.

* * * * *